(12) United States Patent
Hsieh et al.

(10) Patent No.: US 8,658,466 B2
(45) Date of Patent: Feb. 25, 2014

(54) SEMICONDUCTOR PACKAGE STRUCTURE AND METHOD FOR MAKING THE SAME

(75) Inventors: Chin-Tang Hsieh, Kaohsiung (TW);
Chih-Ming Kuo, Hsinchu (TW);
Chia-Jung Tu, Hsinchu (TW);
Shih-Chieh Chang, Chiayi County (TW); Chih-Hsien Ni, Hsinchu (TW);
Lung-Hua Ho, Hsinchu (TW);
Chaun-Yu Wu, Hsinchu (TW);
Kung-An Lin, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 32 days.

(21) Appl. No.: 13/525,460

(22) Filed: Jun. 18, 2012

(65) Prior Publication Data
US 2013/0334681 A1   Dec. 19, 2013

(51) Int. Cl.
*H01L 21/00* (2006.01)
(52) U.S. Cl.
USPC ............ 438/108; 257/777; 257/E21.499
(58) Field of Classification Search
USPC .............. 438/108; 257/737, 777, 778, 686, 257/E21.499, E23.021
See application file for complete search history.

(56) References Cited

U.S. PATENT DOCUMENTS

| | | | | |
|---|---|---|---|---|
| 5,923,955 A | * | 7/1999 | Wong | 438/108 |
| 8,580,607 B2 | * | 11/2013 | Haba | 438/106 |
| 2009/0146303 A1 | * | 6/2009 | Kwon | 438/108 |

* cited by examiner

*Primary Examiner* — Chuong A Luu
*Assistant Examiner* — Nga Doan
(74) *Attorney, Agent, or Firm* — Jackson IPG PLLC

(57) ABSTRACT

A semiconductor package structure includes a first substrate, a second substrate and an encapsulant. The first substrate comprises a plurality of first bumps and a plurality of first solder layers. Each of the first solder layers is formed on each of the first bumps and comprises a cone-shaped slot having an inner surface. The second substrate comprises a plurality of second bumps and a plurality of second solder layers. Each of the second solder layers is formed on each of the second bumps and comprises an outer surface. Each of the second solder layers is a cone-shaped body. The second solder layer couples to the first solder layer and is accommodated within the first solder layer. The inner surface of the cone-shaped slot contacts with the outer surface of the second solder layer. The encapsulant is formed between the first substrate and the second substrate.

13 Claims, 13 Drawing Sheets

SEMICONDUCTOR PACKAGE STRUCTURE AND METHOD FOR MAKING THE SAME

FIELD OF THE INVENTION

The present invention is generally related to a semiconductor package structure, which particularly relates to the thinning semiconductor package structure.

BACKGROUND OF THE INVENTION

With the environmental consciousness rising, the people pay much attention on contamination of semiconductor manufacturing process. Some manufacturers introduce lead-free solder bump in the manufacturing process for contamination reduction. However, the lead-free solder bump behaves brittleness and likely leads a crack phenomenon. Besides, mismatch of the thermal expansion coefficient between a chip and a substrate enables to generate a stress, and the reliability of lead-free package system is directly impacted by mentioned stress. In addition, present underfill may not provide the lead-free solder bump with sufficient protection therefore resulting lower production reliability.

SUMMARY

The primary object of the present invention is to provide a semiconductor package structure including a first substrate, a second substrate and an encapsulation, wherein the first substrate comprises a first surface, a plurality of first conductive pads disposed on the first surface, a plurality of first bumps electrically connected with the first conductive pads and a plurality of first solder layers. Each of the first solder layers is formed on each of the first bumps and comprises a cone-shaped slot having an inner surface. The second substrate comprises a second surface, a plurality of second conductive pads disposed on the second surface, a plurality of second bumps formed on the second conductive pads and a plurality of second solder layers. Each of the second solder layers is formed on each of the second bumps and comprises an outer surface, and the second solder layers are cone-shaped bodies. Each of the second solder layers couples to each of the first solder layers and is accommodated within each of the first solder layers, and the inner surface of each of the cone-shaped slots contacts with the outer surface of each of the second solder layers. The encapsulation is formed between the first substrate and the second substrate. The spacing, existed between the first substrate and the second substrate directly coupled to the first substrate, is relatively smaller than conventionally coupled substrates, besides, the total thickness of the first substrate and the second substrate is relatively smaller than usual coupled substrates owning to the reason that the first solder layers with cone-shaped slots being formed on the first bumps, and also for the reason that "cone-shaped" second solder layers being formed on the second bumps. Therefore, the semiconductor package structure possesses advantages of low contamination, high reliability and cost savings.

DETAILED DESCRIPTION OF THE INVENTION

Figure 1:
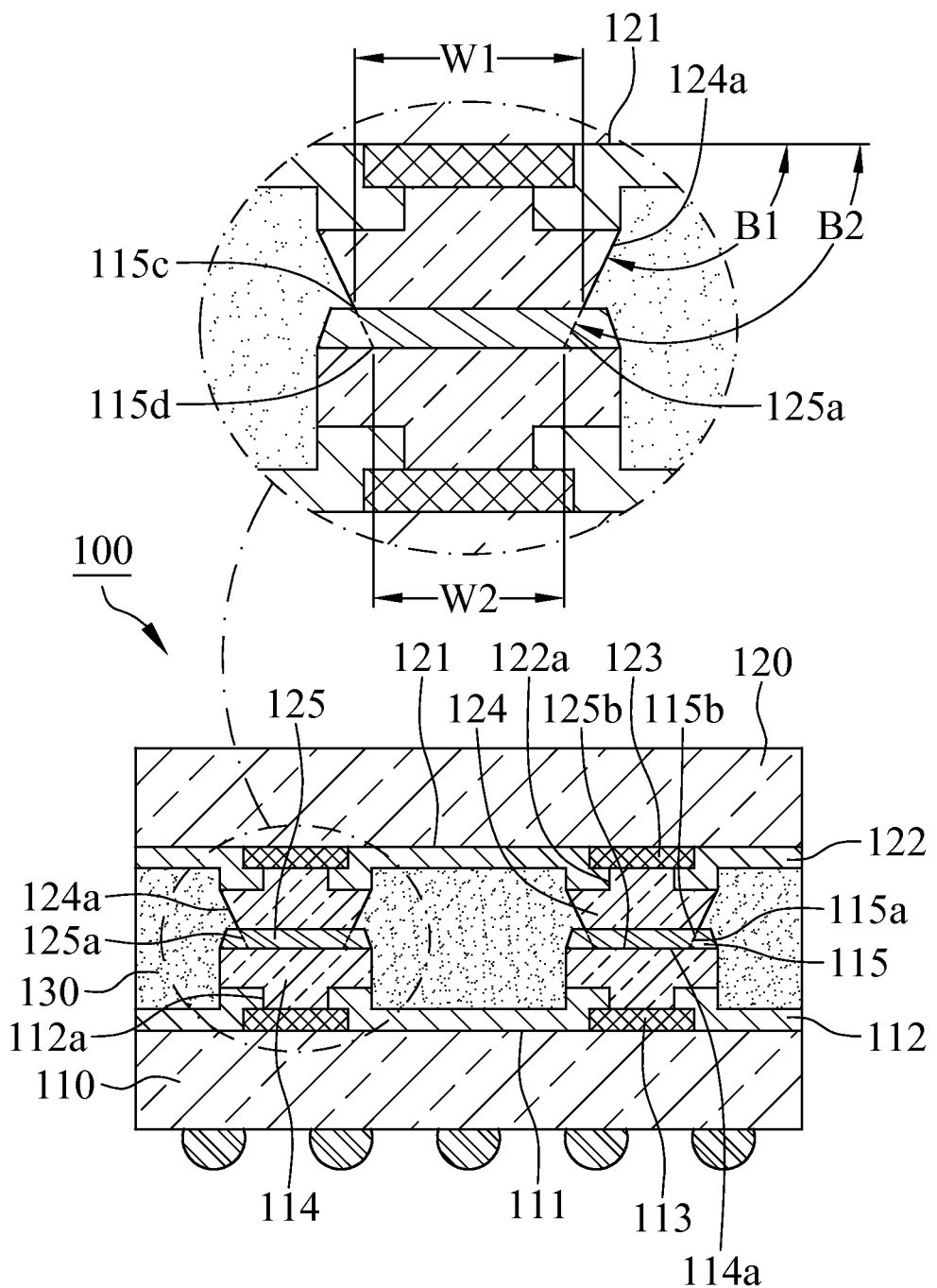
FIG. 1 is a cross-section diagram illustrating a semiconductor package structure in accordance with a first preferred embodiment of the present invention.

With reference to FIG. 1, a semiconductor package structure 100 in accordance with a first preferred embodiment of the present invention includes a first substrate 110, a second substrate 120 and an encapsulant 130. The first substrate 110 comprises a first surface 111, a first protection layer 112 covering the first surface 111, a plurality of first conductive pads 113 disposed on the first surface 111, a plurality of first bumps 114 electrically connected with the first conductive pads 113 and a plurality of first solder layers 115. The first protection layer 112 comprises a plurality of first openings 112a corresponded to the first conductive pads 113 so as to reveal the first conductive pads 113. The material of the first bumps 114 can be selected from one of gold, copper, copper/nickel or copper/nickel/gold, wherein each of the first solder layers 115 is formed on each of the first bumps 114 and comprises a cone-shaped slot 115a having an inner surface 115b, an upper opening 115c and a lower opening 115d. The upper opening 115c comprises a first width W1, and the lower opening 115d comprises a second width W2 smaller than the first width W1. The second substrate 120 comprises a second surface 121, a second protection layer 122 covering the second surface 121, a plurality of second conductive pads 123 disposed on the second surface 121, a plurality of second bumps 124 formed on the second conductive pads 123 and a plurality of second solder layers 125. The second protection layer 122 comprises a plurality of second openings 122a corresponded to the second conductive pads 123 so as to reveal the second conductive pads 123. Each of the second solder layers 125 is formed on each of the second bumps 124. The material of the second bumps 124 can be selected from one of gold, copper, copper/nickel or copper/nickel/gold. In this embodiment, each of the second bumps 124 comprises a cone-shaped surface 124a, wherein a first included angle B1 between the cone-shaped surface 124a and the second surface 121 is larger than 90 degrees. Each of the second solder layers 125 is a cone-shaped body and comprises an outer surface 125a, wherein a second included angle B2 between the outer surface 125a of each of the second solder layers 125 and the second surface 121 is larger than 90 degrees. In this embodiment, each of the second solder layers 125 couples to each of the first solder layers 115, and each of the second solder layers 125 is accommodated within each of the first solder layers 115. The inner surface 115b of each of the cone-shaped slots 115a is in contact with the outer surface 125a of each of the second solder layers 125. Each of the first bumps 114 comprises a first top surface 114a, each of the second solder layers 125 further comprises a second top surface 125b in contact with the first top surface 114a. The encapsulant 130 is formed between the first substrate 110 and the second substrate 120. The spacing, existed between the first substrate 110 and the second substrate 120 coupled to the first substrate 110, is relatively smaller than conventionally coupled substrates, besides, the total thickness of the first substrate 110 and the second substrate 120 is relatively smaller than conventionally coupled substrates as well substrates owning to the reason that the first solder layers 115 with cone-shaped slots 115a being formed on the first bumps 114, and also for the reason that "cone-shaped" second solder layers 125 being formed on the second bumps 124.

Figure 2:
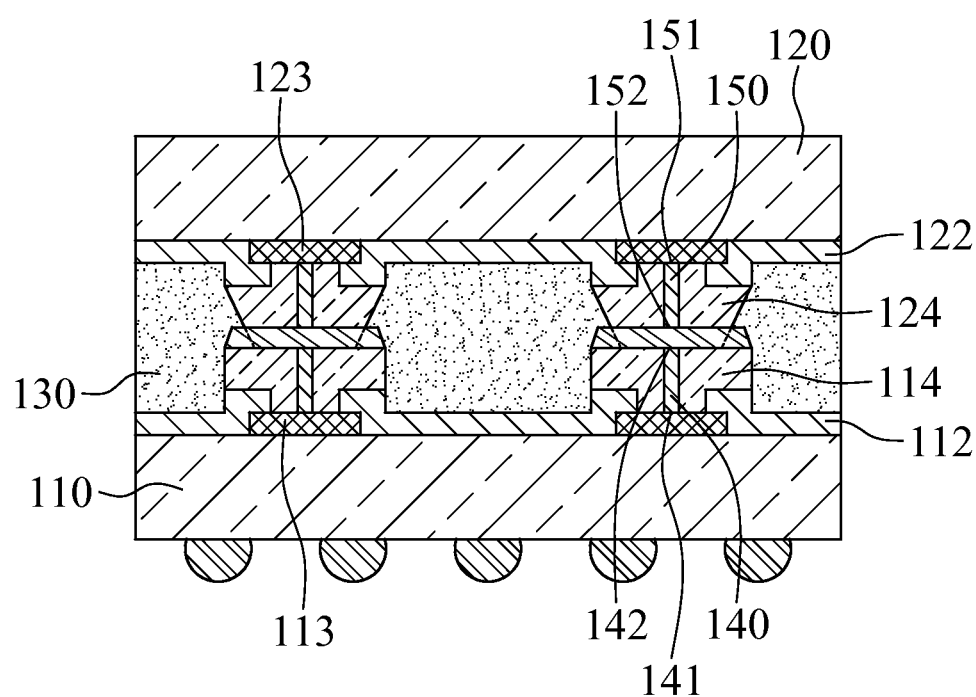
FIG. 2 is a cross-section diagram illustrating a semiconductor package structure in accordance with a second preferred embodiment of the present invention.

Or, a second preferred embodiment is illustrated in FIG. 2. In this embodiment, the material of the first bumps 114 and the second bumps 124 is dielectric material. The semiconductor package structure 100 further includes a plurality of first metallic pillars 140 and a plurality of second metallic pillars 150, wherein each of the first metallic pillars 140 is cladded with each of the first bumps 114. Each of the first metallic pillars 140 comprises a first end 141 and a second end 142, wherein each of the first ends 141 contacts with each of the first bumps 114, and each of the second ends 142 is revealed. Each of the second metallic pillars 150 is cladded with each of the second bumps 124, each of the second metallic pillars 150 comprises a third end 151 and a fourth end 152, wherein each of the third ends 151 is in contact with each of the second bumps 124, and each of the fourth ends 152 is in contact with each of the second solder layers 125.

Figure 3A:
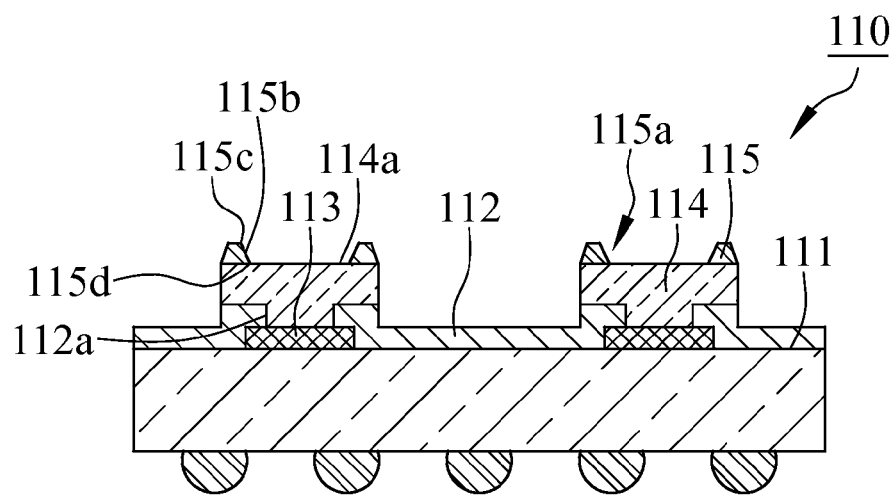
FIGS. 3A to 3B are cross-section diagrams illustrating a semiconductor package structure in accordance with a first preferred embodiment of the present invention.
Figure 3B:
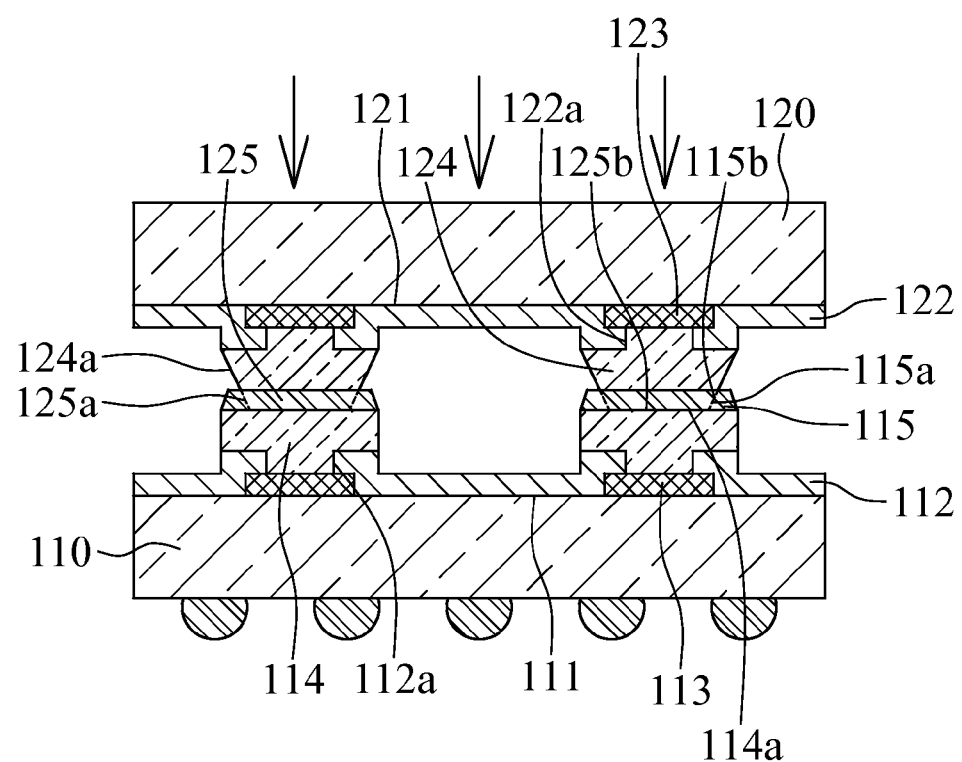
Figure 4A:
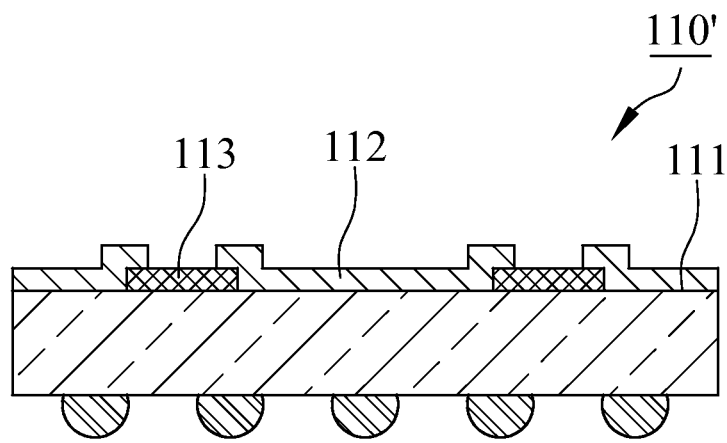
FIGS. 4A to 4I are cross-section diagrams illustrating a method for manufacturing a first substrate in accordance with a first preferred embodiment of the present invention.
Figure 4B:
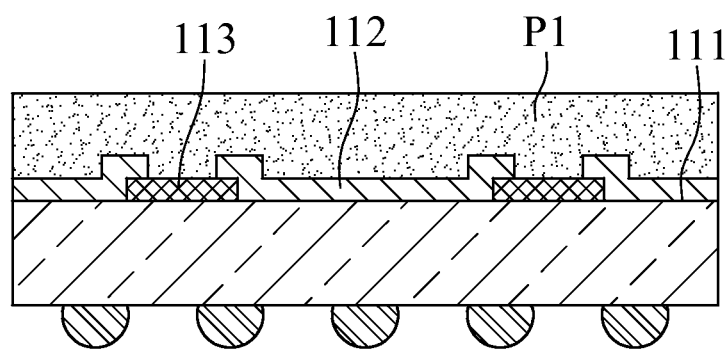
Figure 4C:
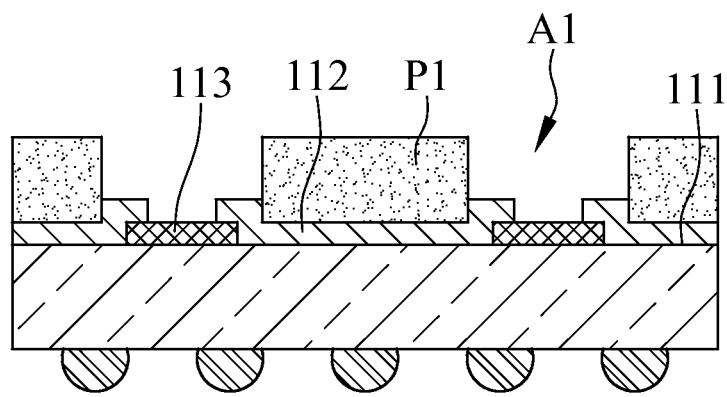
Figure 4D:
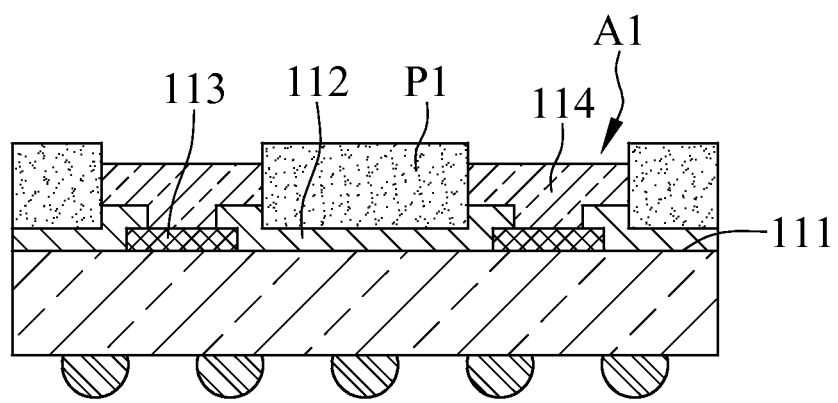
Figure 4E:
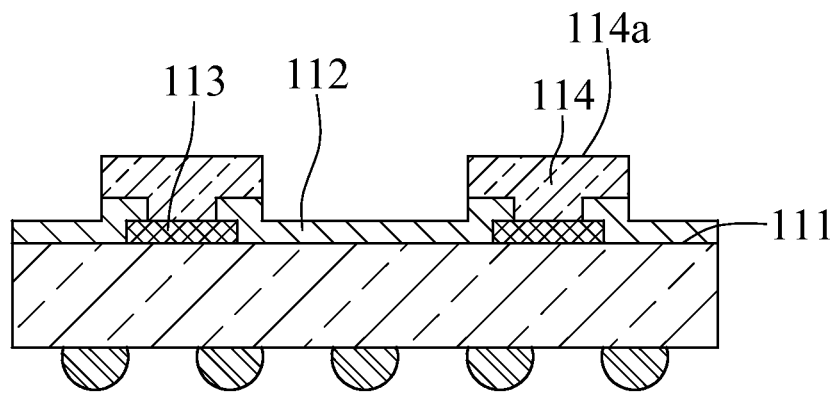
Figure 4F:
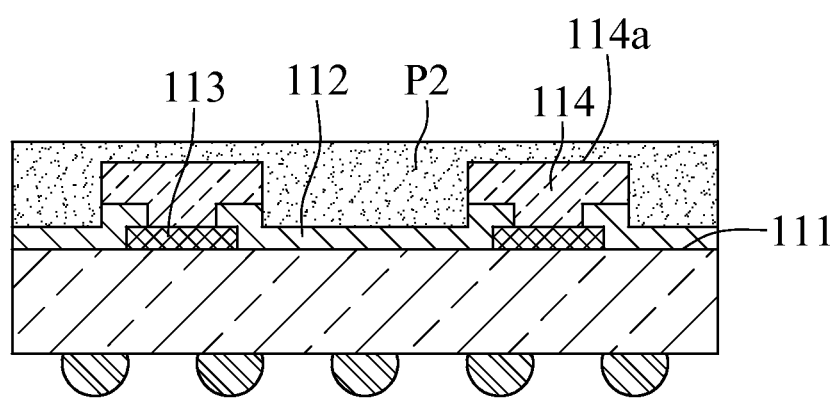
Figure 4G:
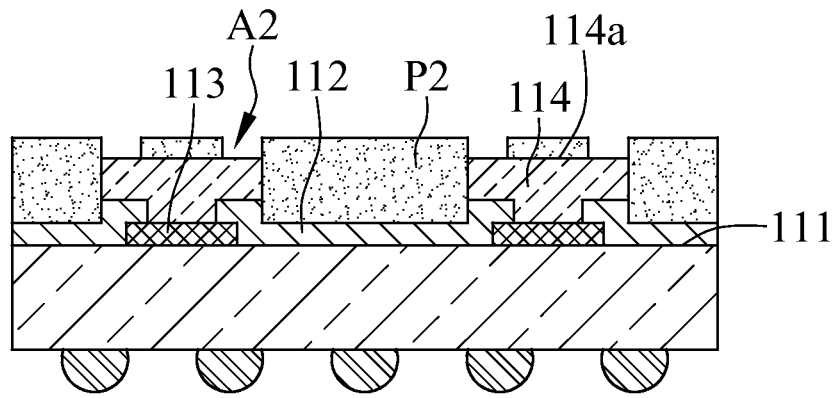
Figure 4H:
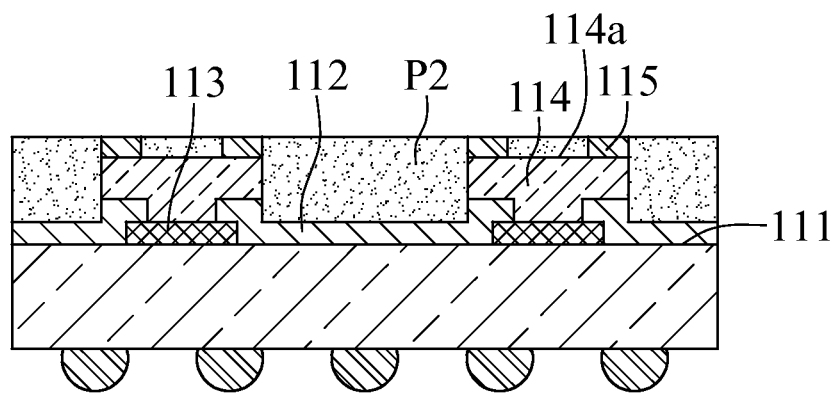
Figure 4I:
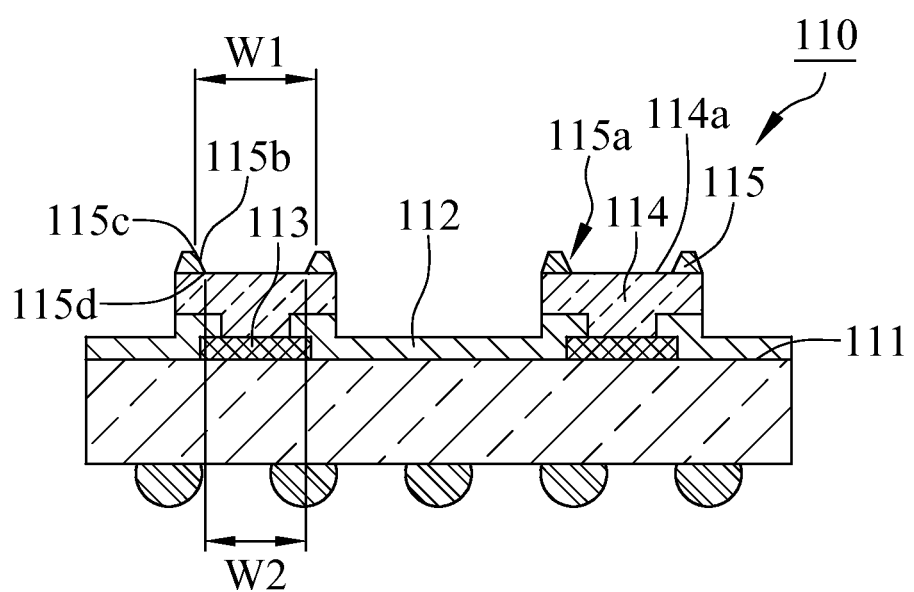
Figure 5A:
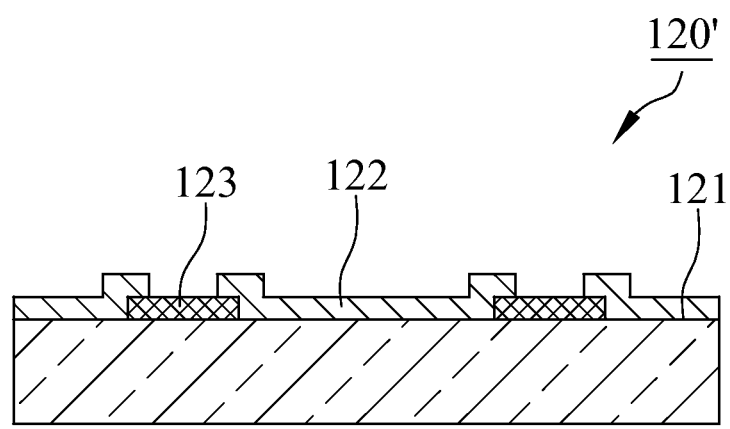
FIG. 5A to 5J are cross-section diagrams illustrating a method for manufacturing a second substrate in accordance with a first preferred embodiment of the present invention.
Figure 5B:
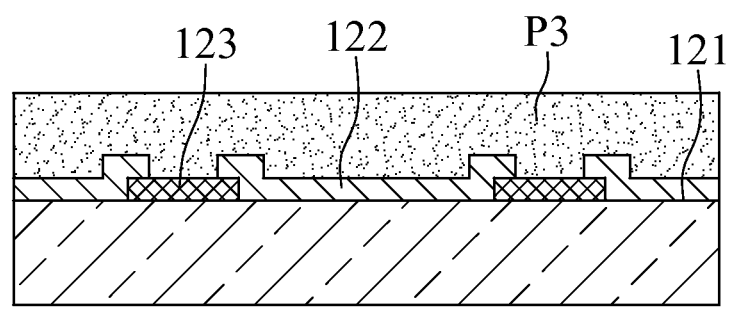
Figure 5C:
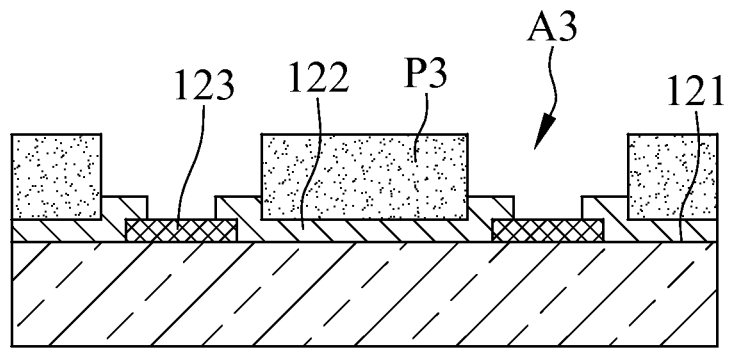
Figure 5D:
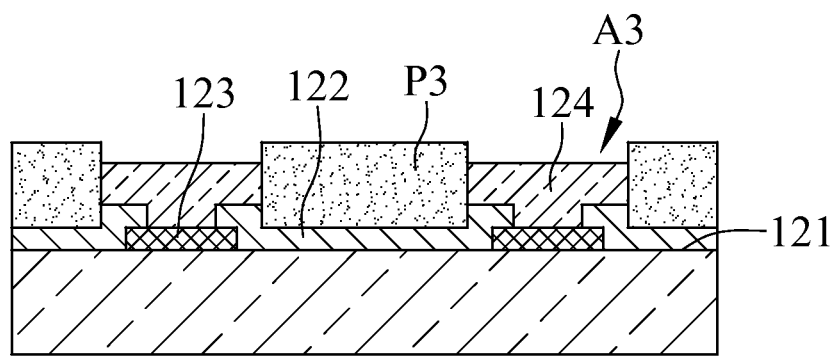
Figure 5E:
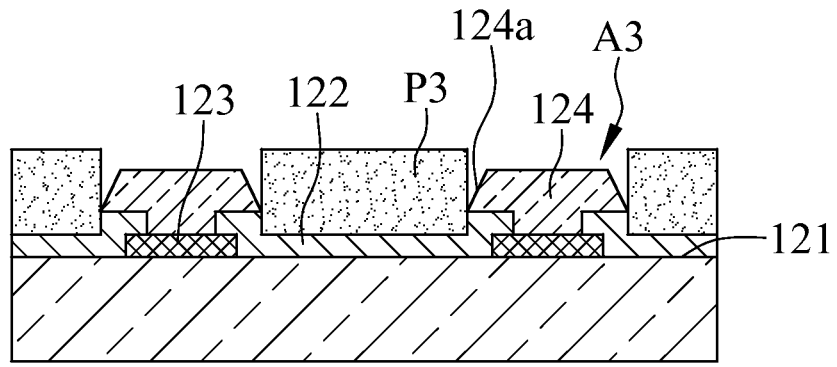
Figure 5F:
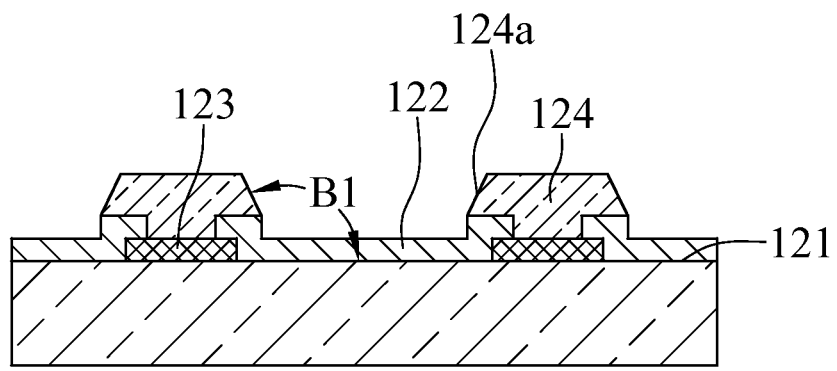
Figure 5G:
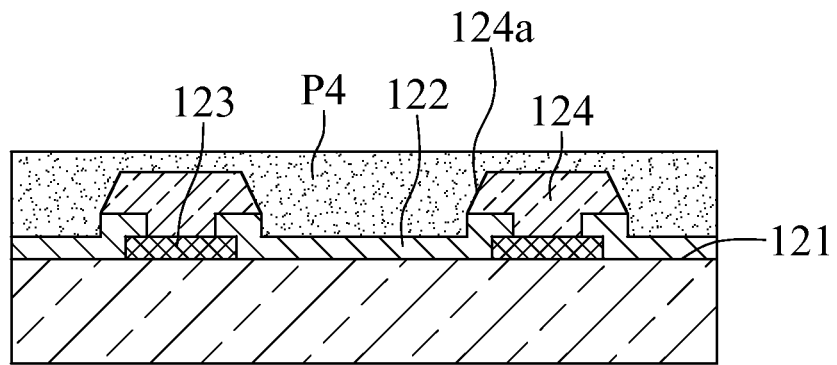
Figure 5H:
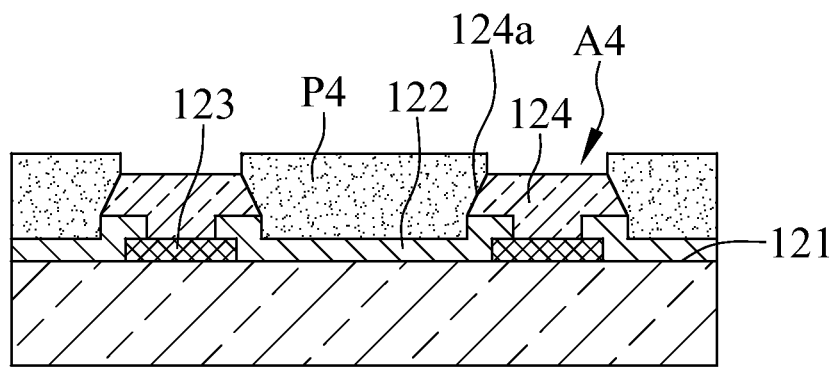
Figure 5I:
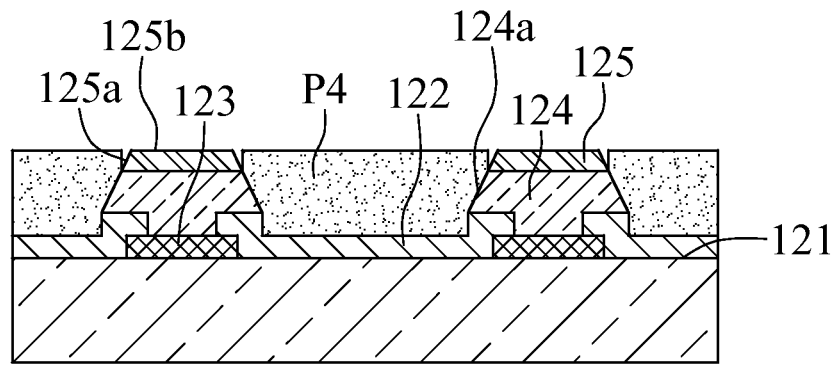
Figure 5J:
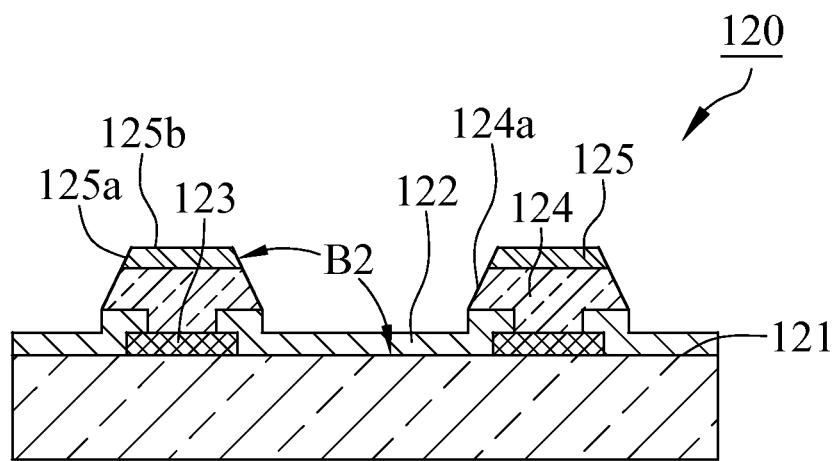

Next, please refer to FIGS. 3A to 3B, a method for making a semiconductor package structure in accordance with the first preferred embodiment of the present invention at least includes the following steps. First, referring to FIG. 3A, providing a first substrate 110 having a first surface 111, a first protection layer 112 covering the first surface 111, a plurality of first conductive pads 113 disposed on the first surface 111, a plurality of first bumps 114 electrically connected with the first conductive pads 113 and a plurality of first solder layers 115, wherein each of the first solder layers 115 is formed on each of the first bumps 114 and comprises a cone-shaped slot 115a having an inner surface 115b.

In this embodiment, a method for manufacturing the first substrate 110 includes the following steps as indicated from FIGS. 4A to 4I. First, referring to FIG. 4A, providing a first base 110' having a first surface 111, a first protection layer 112 covering the first surface 111 and a plurality of first conductive pads 113 disposed on the first surface 111; next, referring to FIG. 4B, forming a first photoresist layer P1 on the first base 110'; thereafter, referring to FIG. 4C, patterning the first photoresist layer P1 to form a plurality of first apertures A1 corresponded to the first conductive pads 113; afterwards, referring to FIG. 4D, forming a plurality of first bumps 114 at the first apertures A1, wherein each of the first bumps 114 comprises a first top surface 114a, and the material of the first bumps 114 can be selected from one of gold, copper, copper/nickel or copper/nickel/gold; then, referring to FIG. 4E, removing the first photoresist layer P1; next, referring to FIG. 4F, forming a second photoresist layer P2 on the first base 110' and covering the first bumps 114 with the second photoresist layer P2; next, referring to FIG. 4G, patterning the second photoresist layer P2 to form a plurality of second apertures A2 corresponded to the first bumps 114; thereafter, referring to FIG. 4H, forming a plurality of first solder layers 115 at the second apertures A2; eventually, referring to FIG. 4I, removing the second photoresist layer P2 to reveal the first solder layers 115 so as to form the first substrate 110. Each of the first solder layers 115 comprises a cone-shaped slot 115a having an inner surface 115b, an upper opening 115c and a lower opening 115d, wherein the upper opening 115c comprises a first width W1, and the lower opening 115d comprises a second width W2 smaller than the first width W1.

Next, with reference to FIG. 3B, flip chip bonding a second substrate 120 to the first substrate 110, wherein the second substrate 120 comprises a second surface 121, a second protection layer 122 covering the second surface 121, a plurality of second conductive pads 123 disposed on the second surface 121, a plurality of second bumps 124 electrically connected with the second conductive pads 123 and a plurality of second solder layers 125, each of the second solder layers 125 is formed on each of the second bumps 124 and comprises an outer surface 125a, and each of the second solder layers 125 is a cone-shaped body.

Besides, with reference to FIGS. 5A to 5J, a method for manufacturing the second substrate 120 includes the following steps as indicated from FIGS. 5A to 5J. First, referring to FIG. 5A, providing a second base 120' having a second surface 121, a second protection layer 122 covering the second surface 121 and a plurality of second conductive pads 123 disposed on the second surface 121; next, referring to FIG. 5B, forming a third photoresist layer P3 on the second base 120'; thereafter, referring to FIG. 5C, patterning the third photoresist layer P3 to form a plurality of third apertures A3 corresponded to the second conductive pads 123; afterwards, referring to FIG. 5D, forming a plurality of second bumps 124 at the third apertures A3, wherein the material of the second bumps 124 can be selected from one of gold, copper, copper/nickel or copper/nickel/gold; afterwards, referring to FIG. 5E, etching each of the second bumps 124 to make each of the second bumps 124 have a cone-shape surface 124a; then, referring to FIG. 5F, removing the third photoresist layer P3 to reveal the second bumps 124, wherein a first included angle B1 between the cone-shaped surface 124a and the second surface 121 is larger than 90 degrees; referring to FIG. 5G, forming a fourth photoresist layer P4 on the second base 120' and covering the second bumps 124 with the fourth photoresist layer P4; next, referring to FIG. 5H, patterning the fourth photoresist layer P4 to form a plurality of fourth apertures A4 corresponded to the second bumps 124; thereafter, referring to FIG. 5I, forming a plurality of second solder layers 125 at the fourth apertures A4, wherein each of the second solder layers 125 comprises a second top surface 125b; eventually, referring to FIG. 5J, removing the fourth photoresist layer P4 to reveal the second solder layers 125 so as to form the second substrate 120. In this embodiment, a second included angle B2 between the outer surface 125a of each of the second solder layers 125 and the second surface 121 is larger than 90 degrees.

Next, with reference to FIG. 3B, pressurizing and heating the second substrate 120 to make each of the second solder layers 125 coupled to each of the first solder layers 115, wherein each of the second solder layers 125 is accommodated within each of the first solder layers 115. The inner surface 115b of each of the cone-shaped slots 115a contacts against the outer surface 125a of each of the second solder layers 125, and the first top surface 114a of each of the first bumps 114 is in contact with the second top surface 125b of each of the second solder layers 125. In the step of pressurizing and heating the second substrate 120, the pressure value ranges from 0.4~120 Newton (N), and the temperature value ranges from 180~460 degrees. Eventually, referring to FIG. 1 again, forming an encapsulant 130 between the first substrate 110 and the second substrate 120 so as to form the semiconductor package structure 100. The first substrate 110 can directly couple to and stack with the second substrate 120 from the causes that the first solder layers 115 having cone-shaped slots 115a and the second solder layers 125 being cone-shaped bodies, which substantially simplify the manufacturing process of the semiconductor package structure 100.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A method for making a semiconductor package structure at least including:

providing a first substrate having a first surface, a plurality of first conductive pads disposed on the first surface, a plurality of first bumps electrically connected with the first conductive pads and a plurality of first solder layers, wherein each of the first solder layers is formed on each of the first bumps and comprises a cone-shaped slot having an inner surface;

flip chip bonding a second substrate to the first substrate, wherein the second substrate comprises a second surface, a plurality of second conductive pads disposed on the second surface, a plurality of second bumps electrically connected with the second conductive pads and a plurality of second solder layers, each of the second solder layers is formed on each of the second bumps and comprises an outer surface, and each of the second solder layers is a cone-shaped body;

pressurizing and heating the second substrate to make each of the second solder layers coupled to each of the first solder layers, wherein each of the second solder layers is accommodated within each of the first solder layers, and the inner surface of each of the cone-shaped slots contacts against the outer surface of each of the second solder layers; and forming an encapsulant between the first substrate and the second substrate.

2. The method for making a semiconductor package structure in accordance with claim 1, wherein in the step of pressurizing and heating the second substrate, the pressure ranges from 0.4 to 120 N, and the temperature ranges from 180 to 460 degrees.

3. The method for making a semiconductor package structure in accordance with claim 1, wherein a method for manufacturing the first substrate including:

providing a first base having a first surface and a plurality of first conductive pads disposed on the first surface;
forming a first photoresist layer on the first base;
patterning the first photoresist layer to form a plurality of first apertures corresponded to the first conductive pads;
forming a plurality of first bumps at the first apertures;
removing the first photoresist layer;
forming a second photoresist layer on the first base and covering the first bumps with the second photoresist layer;
patterning the second photoresist layer to form a plurality of second apertures corresponded to the first bumps;
forming a plurality of first solder layers at the second apertures, wherein each of the first solder layers comprises a cone-shaped slot having an inner surface; and
removing the second photoresist layer.

4. The method for making a semiconductor package structure in accordance with claim 1, wherein a method for manufacturing the second substrate including:

providing a second base having a second surface and a plurality of second conductive pads disposed on the second surface;
forming a third photoresist layer on the second base;
patterning the third photoresist layer to form a plurality of third apertures corresponded to the second conductive pads;
forming a plurality of second bumps at the third apertures;
etching each of the second bumps to make each of the second bumps have a cone-shape surface;
removing the third photoresist layer;
forming a fourth photoresist layer on the second base and covering the second bumps with the fourth photoresist layer;
patterning the fourth photoresist layer to form a plurality of fourth apertures corresponded to the second bumps;
forming a plurality of second solder layers at the fourth apertures; and
removing the fourth photoresist layer.

5. The method for making a semiconductor package structure in accordance with claim 1, wherein each of the first bumps comprises a first top surface, each of the second solder layers further comprises a second top surface in contact with the first top surface.

6. The method for making a semiconductor package structure in accordance with claim 1, wherein each of the cone-shaped slots comprises an upper opening and a lower opening, the upper opening comprises a first width, the lower opening comprises a second width smaller than the first width.

7. The method for making a semiconductor package structure in accordance with claim 1, wherein the material of the first bumps and the second bumps can be selected from one of gold, copper, copper/nickel or copper/nickel/gold.

8. The method for making a semiconductor package structure in accordance with claim 1, wherein the material of the first bumps is dielectric material.

9. The method for making a semiconductor package structure in accordance with claim 8 further includes a plurality of first metallic pillars, wherein each of the first metallic pillars is cladded with each of the first bumps, each of the first metallic pillars comprises a first end and a second end, each of the first ends is in contact with each of the first bumps, and each of the second ends is revealed.

10. The method for making a semiconductor package structure in accordance with claim 1, wherein the material of the second bumps is dielectric material.

11. The method for making a semiconductor package structure in accordance with claim 10 further includes a plurality of second metallic pillars, wherein each of the second metallic pillars is cladded with each of the second bumps, each of the second metallic pillars comprises a third end and a fourth end, each of the third ends is in contact with each of the second bumps, and each of the fourth ends is in contact with each of the second solder layers.

12. The method for making a semiconductor package structure in accordance with claim 4, wherein a first included angle between the cone-shaped surface and the second surface is larger than 90 degrees.

13. The method for making a semiconductor package structure in accordance with claim 1, wherein a second included angle between the outer surface of each of the second solder layers and the second surface is larger than 90 degrees.

* * * * *